United States Patent [19]
Callicotte et al.

[11] Patent Number: 5,764,100
[45] Date of Patent: Jun. 9, 1998

[54] FILTER

[75] Inventors: Mark J. Callicotte, Oak Park; John K. Grosspietsch, Vernon Hills, both of Ill.

[73] Assignee: Motorola, Inc., Schaumburg, Ill.

[21] Appl. No.: 800,008

[22] Filed: Feb. 13, 1997

[51] Int. Cl.[6] .................. H03K 5/00; H03F 1/00
[52] U.S. Cl. .............. 327/554; 327/341; 327/552; 333/173; 330/9
[58] Field of Search .................. 327/552, 554, 327/94, 103, 560, 362, 337, 341; 333/173; 330/9, 107

[56] References Cited

U.S. PATENT DOCUMENTS 4,429,281  1/1984  Ito et al. .................. 327/554

OTHER PUBLICATIONS

R. Schaumann et al., *Design of Analog Filters: Passive, Active RC, and Switched Capacitor*, pp. 308–313, 1990.

*Primary Examiner*—Timothy P. Callahan
*Assistant Examiner*—Dinh Le
*Attorney, Agent, or Firm*—Donald Kordich; Lalita P. Williams

[57] ABSTRACT

A transconductance filter (200) comprises multiple stages of a transconductor (110,120,130) having an input and an output, and a switch (260,265,270) coupled between the output and the voltage source. The switch is operatively responsive to the control signal for coupling and decoupling the voltage source directly to the output of the transconductor at least prior to the time the filter is required to filter the input voltage signal. The voltage source is within a predetermined input voltage range of the transconductor defined by a region in which a transconductance of the transconductor is substantially constant and positive.

11 Claims, 3 Drawing Sheets

FILTER

FIELD OF THE INVENTION

The present invention relates generally to the field of filters, and more particularly to a transconductance-capacitor filter.

BACKGROUND OF THE INVENTION

It is known to filter analog signals to remove signal components at certain unwanted frequencies. For example, an analog signal produced from a digital-to-analog conversion of a digitally represented signal may include signal components at unwanted frequencies that require filtering.

An example of a conventional multi-stage transconductance-capacitor (Gm-C) filter 100 for removing unwanted frequencies is show in FIG. 1. An input voltage signal with a predetermined maximum peak-to-peak voltage excursion is applied to a terminal 105, which is coupled to a non-inverting input of a transconductor 110. The input voltage signal is thus applied to the non-inverting input of transconductor 110. Transconductor 110 converts the input voltage signal into an output current signal. The output of transconductor 110 and a non-inverting input of a transconductor 120 are coupled together to form a node 145. A capacitor 115 has one of its ends coupled to node 145 and the other end coupled to a voltage source, Vag. The first stage of the multi-stage filter is comprised of transconductor 110 and capacitor 115.

The output current signal of transconductor 110 is applied to capacitor 115, which creates an output voltage signal at node 145. This output voltage signal is applied to the second stage of the multi-stage filter that is comprised of transconductor 120 and a capacitor 125. Transconductor 120 converts the output voltage signal at node 145, which is applied to the non-inverting input of transconductor 120, into an output current signal. The output of transconductor 120, a non-inverting input of a transconductor 130, and an inverting input of transconductor 110 are coupled together to form a node 150. A capacitor 125 has one of its ends coupled to node 150 and the other end coupled to Vag. 150. A capacitor 125 has one of its ends coupled to node 150 and the other end coupled to Vag.

The output current signal of transconductor 120 is applied to capacitor 125, which creates an output voltage signal at node 150. This output voltage signal is applied to the non-inverting input of transconductor 130 and the inverting input of transconductor 110. Transconductor 130 converts the voltage signal at node 150 into an output current signal. The output of transconductor 130 and a terminal 140 are coupled together to form a ncode 160. A capacitor 135 has one of its ends coupled to node 160 and the other end coupled to Vag.

The output current signal of transconductor 130 is applied to capacitor 135, which creates an output voltage signal at node 160. This output voltage signal is applied to terminal 140, the inverting input of transconductor 130, and the inverting input of transconductor 120, which are coupled to node 160.

Additional stages could be added in a similar manner to obtain higher-order filters.

Gm-C filters are well-suited for removing signal components at unwanted frequencies because of their large operating bandwidth and the ability to easily tune the filter parameters to correct for temperature changes and variations in component values. Further, they are designed to be stable for operating conditions ranging from circuit ground to the circuit supply voltage. Because of this design requirement, Gm-C filters are relatively large in terms of die area on an integrated-circuit. Furthermore, they consume large amounts of current in order for the filter to remain stable over all possible integrated-circuit process variations, temperature changes, and supply voltages.

A need therefore exists for a Gm-C filter that has a smaller die area and lower power consumption than known Gm-C filters and still maintains stable operation.

SUMMARY OF THE PREFERRED EMBODIMENT

Figure 1:
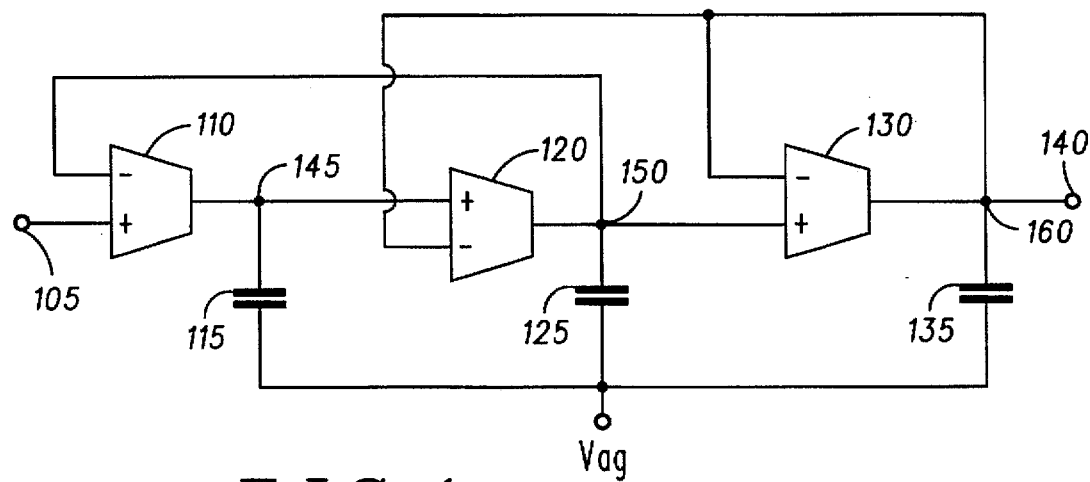
FIG. 1 is an electrical schematic of a conventional transconductance-capacitor filter.

The present invention provides a filter having an input voltage signal and a control signal provided thereto wherein the filter includes a first transconductor with an input and an output, the input voltage signal applied to the input; a first capacitor coupled to the output of the first transconductor; a voltage source coupled to the capacitor, the voltage source within a predetermined input voltage range of the transconductor defined by a region in which a transconductance of the transconductor is substantially constant and positive; and a first switch coupled in parallel to the first capacitor, operatively responsive to the control signal, for bypassing the first capacitor at least prior to the time the filter is required to filter the input voltage signal.-On

DESCRIPTION OF THE PREFERRED EMBODIMENTS

The filter described herein provides advantages over known transconductance-capacitor filters in that a smaller die area and lower power consumption than known Gm-C filters can be achieved, while maintaining stable operation of the filter.

According to the present invention, the foregoing advantages are principally provided by a transconductor having an output and a switch coupled between the output and a voltage source. The switch is operatively responsive to a control signal for coupling and decoupling the voltage source directly to the output of the transconductor. The filter can be made of stages of this basic filter design.

In accordance with an aspect of the invention, the voltage source is within a predetermined input voltage range of the transconductor defined by a region in which a transconductance of the transconductor is substantially constant and positive.

In accordance with another aspect of the invention, the switch, in response to the control signal, couples the voltage source directly to the output of the transconductor at least prior to the time the filter is required to filter an input voltage signal. Thus the initial conditions of the transconductor are limited prior to filtering the input voltage signal, ensuring the filter will be at a stable point when it begins filtering. Accordingly, the filter need not be designed to operate on conditions ranging from circuit ground to the circuit supply voltage; and the filter according to the invention consumes less die area and consumes less current than conventional Gm-C filters.

In accordance with another aspect of the invention, the switch is coupled in parallel to the capacitor, and bypasses the capacitor when it couples the voltage source directly to the output of the transconductor Additional advantages and novel features of the invention will be set forth in part in the description which follows, wherein I have shown and described only the preferred embodiments of the invention, and in part become apparent to those skilled in the art upon examination of the following detailed description or may be learned by practice of the invention. The invention is capable of other and different embodiments, and its several details are capable of modification, all without departing from the scope of the invention. The advantages of the invention may be realized and attained by means of the instrumentalities and combinations particularly pointed out in the appended claims.

Reference will now be made in detail to an embodiment configured according to the present invention.

Figure 2:
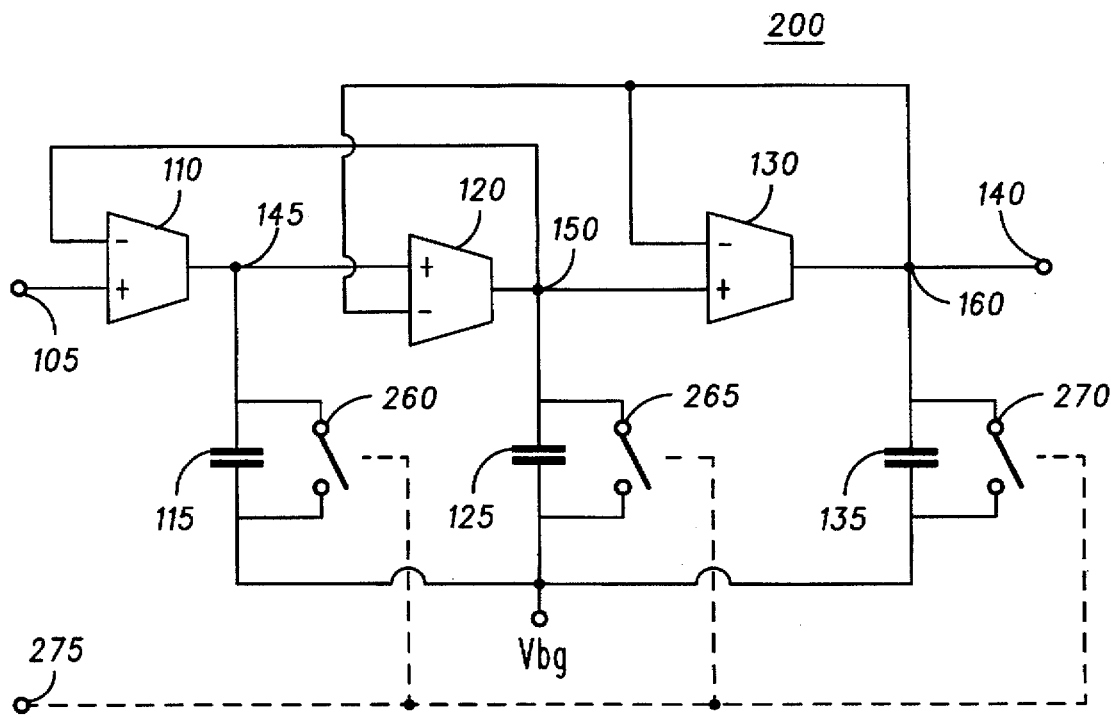
FIG. 2 and 2a is an electrical schematic of a filter configured according to the present invention.
Figure 2A:
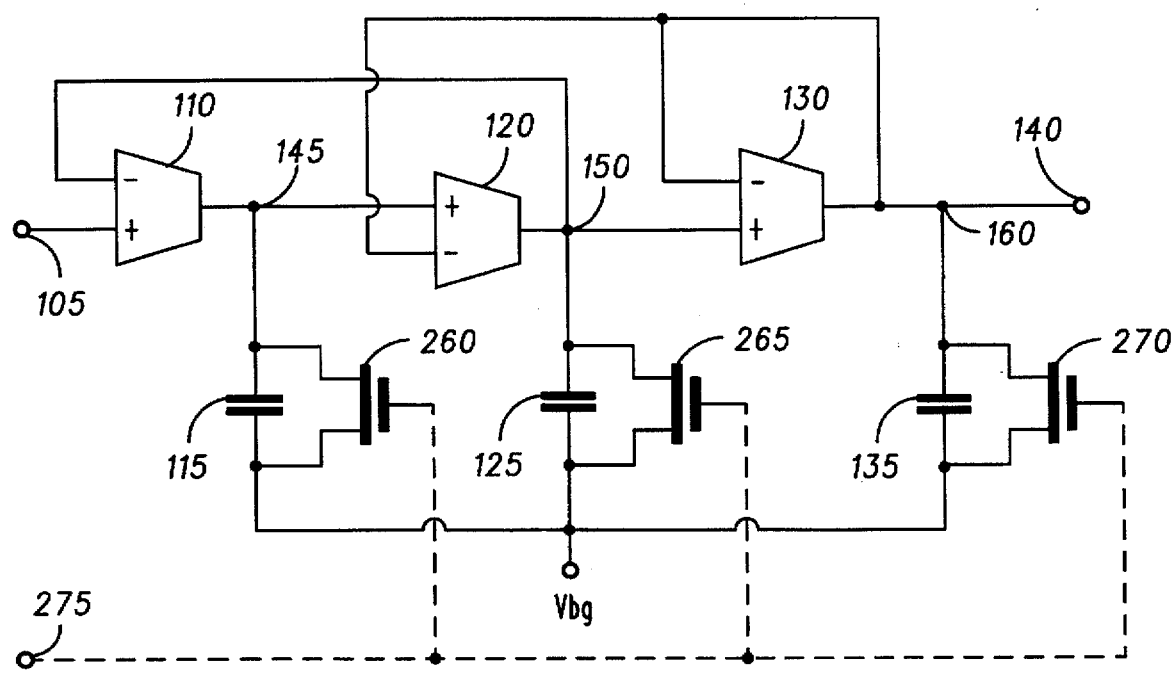

FIG. 2 and 2a are an electrical schematic of a filter 200 configured according to the invention. Where appropriate the same reference numerals are used to avoid unnecessary duplication and description of similar elements already referred to and described in FIG. 1. Only the significant differences of the filter configured according to the invention as compared to the conventional transconductance-capacitor filter will be discussed hereafter. Although the transconductors shown in FIG. 2 have the same reference numerals, they consume less die area and consume less current than conventional transconductors.

A plurality of switches 260,265,270 are coupled between the output of transconductors 110,120,130, respectively, and in parallel to the capacitors 115,125,135, respectively. A switch can be a metallic-oxide semiconductor field-effect transistor (MOSFET) integrated-circuit device.

Switches 260,265,270 are operatively responsive to a control signal 275. Control signal 275 is activated when the filter is not required to filter an input voltage signal. When the control signal is activated, switches 260,265,270 are closed, thus electrically bypassing capacitors 115,125,135, respectively. Furthermore, the closed switches couple the voltage source directly to the output of the transconductors. On the other hand, when the filter is required to pass a filtered signal, control signal 275 is deactivated, and the switches are thus open.

Although in the preferred embodiment the switches directly couple the voltage source to the output of the transconductors during the duration the filter is not required to filter the input voltage signal, it is only necessary that the switches can directly couple the voltage source to the output of the transconductors at a time just prior to the time the filter is required to filter the input voltage signal. This is an important feature of the invention. Because the voltage source is directly coupled to the output of the transconductor at a time just prior to the time the filter is required to filter the input voltage signal, the initial conditions on nodes 145,150,160 are fixed, thus ensuring that the filter will start filtering at a stable operating point.

Furthermore, although in the preferred embodiment the switches are coupled in parallel to the capacitors, it is only necessary that the switches can directly couple the voltage source to the output of the transconductor. Thus the capacitors, either as a group or individually, may instead be coupled to circuit ground or to any other voltage.

Figure 3:
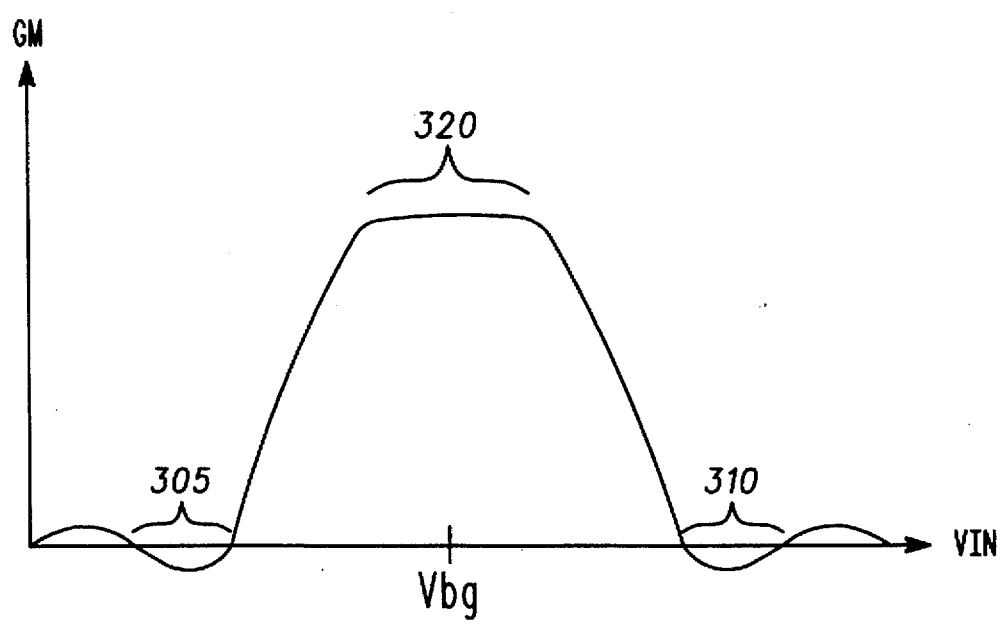
FIG. 3 is a chart illustrating the output transconductance of an exemplary transconductor of the filter configured according to the present invention.

FIG. 3 illustrates the output transconductance of an exemplary transconductor versus the input voltage to the transconductor. The input voltage is defined as the difference between the non-inverting and inverting inputs to the transconductor. The output transconductance is defined as output current divided by input voltage, and is denoted as Gm. The output transconductance has a limited input voltage range about which Gm remains substantially constant and positive, denoted by region 320. When operated outside of the range, the filter can produce unacceptable distortion of the signal to be filtered. The center of this operating range is denoted as Vbg and is shown in FIG. 3 as voltage 315. The preferred embodiment of the invention initializes the internal voltage nodes of the filter to Vbg, although the internal voltage nodes 145,150,160 only need to be initialized to a voltage value within the region 320.

In the regions 305 and 310, the Gm of the transconductor becomes negative. When operated within these input voltage ranges, the filter can become unstable, causing oscillations at the output. By initializing the filter using the switches to directly couple the voltage source to the output of the transconductor at a time just prior to the time the filter is required to filter the input voltage signal and by limiting the input voltage within region 320 by well known techniques, stability of the filter can be maintained even though the transconductance elements have regions where they would become unstable. Without the invention, the transconductor would need to be designed so as to not have any regions of negative Gm, adding both to the size and power consumption of the filter.

In summary, a filter has been described that provides advantages over known transconductance-capacitor filters in that a smaller die area and lower power consumption than known Gm-C filters can be achieved, while maintaining stable operation of the filter. A switch couples a voltage source directly to the output of the transconductor. The voltage source has a value within an input voltage range in which Gm remains substantially constant and positive.

What is claimed is:

1. A filter, wherein an input voltage signal and a control signal is provided, the filter comprising:
   a first transconductor having an input and an output, wherein the input voltage signal is applied to the input;
   a first capacitor coupled to the output of the first transconductor;
   a voltage source coupled to the capacitor wherein the voltage source is within a predetermined input voltage range of the transconductor defined by a region in which a transconductance of the transconductor is substantially constant and positive; and
   a first switch coupled in parallel to the first capacitor, operatively responsive to the control signal, for bypassing the first capacitor at least prior to the time the filter is required to filter the input voltage signal.

2. The filter of claim 1 further comprising:
   a second transconductor having an input and an output, wherein the input of the second transconductor is coupled to the output of the first transconductor and the output of the second transconductor is coupled to the input of the first transconductor;
   a second capacitor coupled between the output of the second transconductor and the voltage source; and
   a second switch coupled in parallel to the second capacitor, operatively responsive to the control signal, for bypassing the second capacitor at least prior to the time the filter is required to filter the input voltage signal.

3. The filter of claim 2 further comprising:
   a third transconductor having an input and an output, wherein the input of the third transconductor is coupled to the output of the second transconductor and the output of the third transconductor is coupled to the input of the second transconductor and to the input of the third transconductor;

a third capacitor coupled between the output of the third transconductor and the voltage source; and a third switch coupled in parallel to the third capacitor, operatively responsive to the control signal, for bypassing the third capacitor at least prior to the time the filter is required to filter the input voltage signal.

4. A filter, wherein an input voltage signal and a control signal is provided, the filter comprising:

a transconductor having an input and an output, for converting the input voltage signal applied to the input to a current signal at the output;

a capacitor coupled to the output of the transconductor, for converting the current signal to an output voltage signal;

a voltage source coupled to the transconductor, wherein the voltage source is within a predetermined input voltage range of the transconductor defined by a region in which a transconductance of the transconductor is substantially constant and positive: and a switch coupled between the output and the voltage source, operatively responsive to the control signal, for coupling the voltage source directly to the output of the transconductor at least prior to the time the filter is required to filter the input voltage signal.

5. The filter of claim 4 wherein the switch is a MOSFET integrated-circuit device.

6. The filter of claim 4 wherein the capacitor is coupled between the output of the transconductor and the voltage source, and the switch is coupled in parallel to the capacitor, wherein the switch is operatively responsive to the control signal to bypass the capacitor at least prior to the time the filter is required to filter the input voltage signal.

7. The filter of claim 4 wherein the switch directly couples the voltage source to the output of the transconductor during the duration the filter is not required to filter the input voltage signal.

8. A filter, wherein an input voltage signal and a control signal is provided, the filter comprising:

a transconductor having an input and an output, for converting the input voltage signal applied, to the input to a current signal at the output;

a capacitor coupled to the output of the transconductor, for converting the current signal to an output voltage signal;

a voltage source coupled to the capacitor, wherein the voltage source is within a predetermined input voltage range of the transconductor defined by a region in which a transconductance of the transconductor is substantially constant and positive; and a switch coupled between the output and the voltage source and in parallel to the capacitor, operatively responsive to the control signal for bypassing the capacitor and coupling the voltage source directly to the output of the transconductor when the filter is not required to filter the input voltage signal.

9. A multi-stage filter, each stage of the filter comprising:

a transconductor having an output;

a voltage source within a predetermined input voltage range of the transconductor defined by a region in which a transconductance of the transconductor is substantially constant and positive: and a switch coupled between the output and the voltage source, for coupling the voltage source directly to the output of the transconductor.

10. The multi-stage filter of claim 9 wherein each stage further comprising a capacitor coupled to the output of the transconductor.

11. The multi-stage filter of claim 10 wherein the capacitor is coupled in parallel with the switch.

* * * * *